United States Patent [19]
Welter

[11] 3,946,268
[45] Mar. 23, 1976

[54] FIELD EMISSION GUN IMPROVEMENT

[75] Inventor: Leonard M. Welter, Saratoga, Calif.

[73] Assignee: American Optical Corporation, Southbridge, Mass.

[22] Filed: Oct. 21, 1974

[21] Appl. No.: 516,323

[52] U.S. Cl. ............. 315/31 R; 250/311; 315/12 R; 315/17; 315/16; 313/449
[51] Int. Cl.² .......................................... H01J 29/56
[58] Field of Search ......... 315/14, 17, 31 R, 31 TV, 315/12 R, 16; 250/310, 311; 313/448, 449, 446, 360

[56] References Cited
UNITED STATES PATENTS

| | | | |
|---|---|---|---|
| 2,407,906 | 9/1946 | Rose | 313/448 |
| 2,716,204 | 8/1955 | Rodenhuis | 315/17 |
| 2,888,606 | 5/1959 | Beam | 315/31 TV |
| 2,983,842 | 10/1975 | Hrbek | 315/16 |
| 3,784,815 | 1/1974 | Coates et al. | 250/311 |
| 3,873,878 | 3/1975 | Odenthal | 313/449 |

Primary Examiner—Maynard R. Wilbur
Assistant Examiner—T. M. Blum
Attorney, Agent, or Firm—H. R. Berkenstock, Jr.; William C. Nealon

[57] ABSTRACT

A field emission gun for use in an instrument such as an electron microscope including the field emission tip, an extraction electrode and focusing and accelerating anode means wherein there is disposed between the tip and the accelerating field of the anode means an electric field of a strength expressed in terms of electron voltage, at least equal to the lowest energy secondary electron sought to be prevented from entering the accelerating field.

6 Claims, 6 Drawing Figures

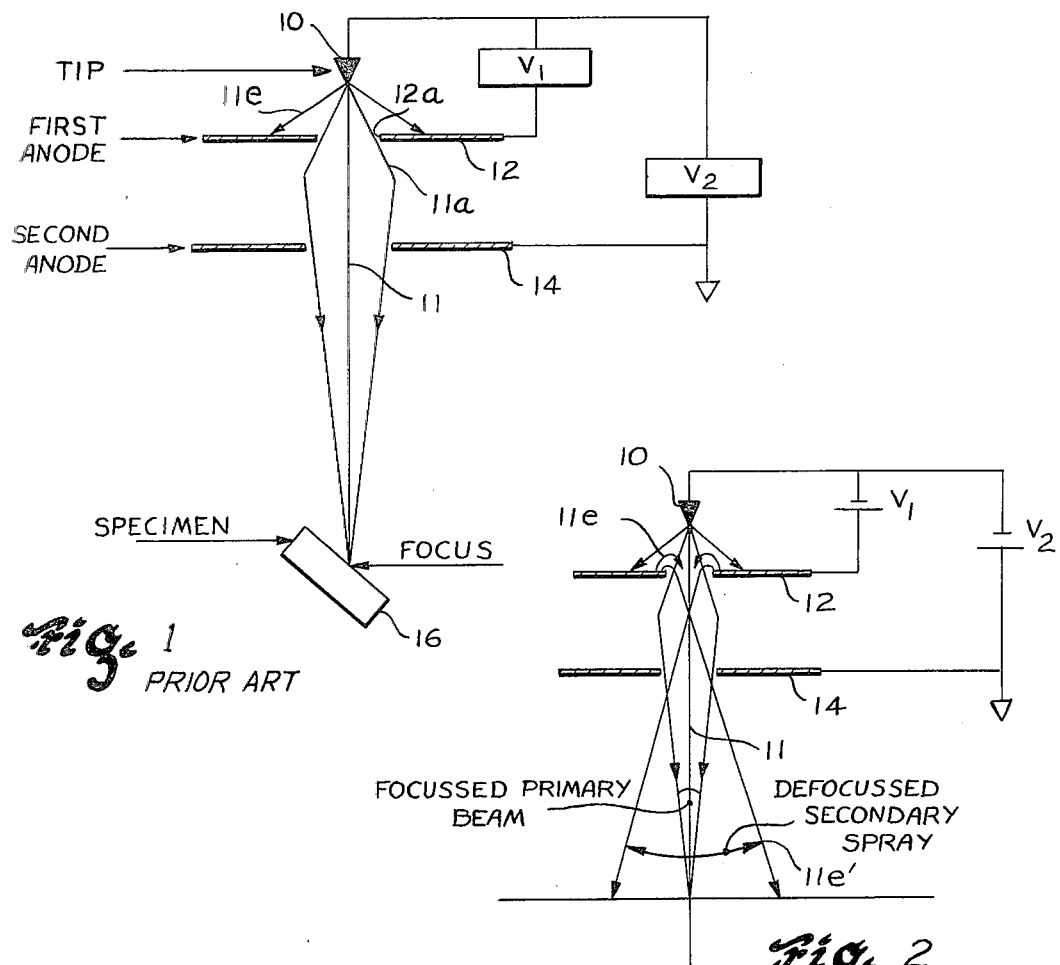
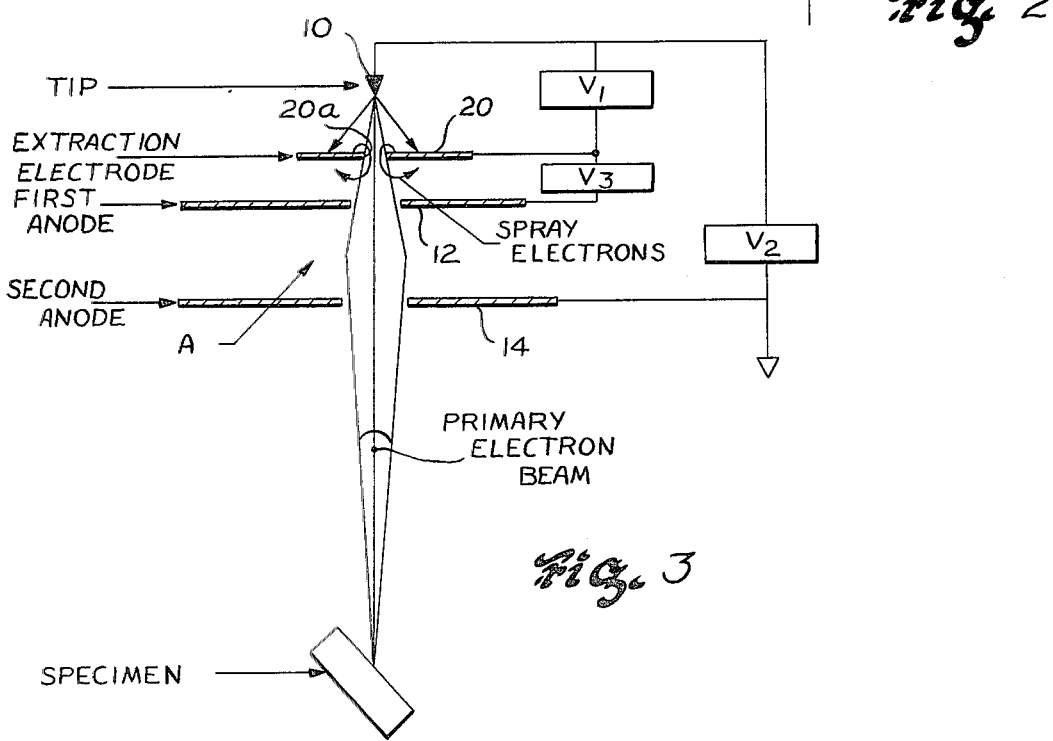

3,946,268

FIELD EMISSION GUN IMPROVEMENT

BACKGROUND OF THE INVENTION

This invention relates, in general, to electron optical systems and more particularly to a field emission gun for producing a beam of charged particles, such as ions or electrons.

In U.S. Pat Nos. 3,678,333 and 3,766,427, and Application Ser. No. 225,970 filed Feb. 14, 1972 in the name of Vincent J. Coates and Leonard M. Welter, (all commonly assigned to the assignee of the present application) there are described scanning electron microscopes employing field emission guns in which the present invention may be advantageously embodied. These aforementioned patents and applications are herein incorporated by reference for a fuller understanding of the present invention.

The utilization of the field emission gun incorporating such as a cold field emitting tip under high vacuum permits the formation of a high intensity focused beam of charged particles (e.g. electrons) as an illuminating vehicle for scanning electron microscopy. The charged particle gun of the referenced patents and application provides the high vacuum environment and voltage discharge protection which is required for stable field emission microscopy.

In implementing this high voltage protection, the inclusion of such as shield electrodes placed about the peripheral region of the tip, a separate field operating electrode placed in juxtaposition to the tip, and various structural forms of field electrodes (individually or in combination) were included in the preferred forms of field emission guns.

The operation of these described highly stable, reliable systems is often as a self-focusing electron accelerating system without the use of additional de-magnification lenses so common in thermionic electron microcopy. In such embodiments, the field emission gun operates to form a focused image of the electron beam in a preselected image plane without additional lenses other than those electrodes forming the main focusing and accelerating anodes of the basic field emission gun. In those embodiments of field emission generators utilized in scanning electron microscopy the charged particle beam is focused in a plane occurring on the surface of a specimen to be examined and scanned over the surface area to be investigated by driving the beam by deflection means in a raster pattern. The impacting of the charged particles of the beam upon the specimen causes, in the case of an electron beam, electrons to be scattered, reflected and emitted from the general surface of the specimen under bombardment. Usual scanning electron microscopy techniques includes detecting one or more of the various types of electrons exiting the surface of the specimen by means such as a scintillator detector, the response of which is portrayed on a recording device such as a cathode ray tube, film or the like.

In field emission scanning microscopy, the beam intensity is sufficiently high such that "real time" viewing of the specimen surface may be enjoyed by synchronizing the electron beam directly to the writing beam of a television-type CRT and modulating that beam by the output of the detector.

In the system as described above, the quality of the image viewed of the surface of the specimen is closely related to the detection of the selected types of charged particles exiting the surface of the specimen to the exclusion of other particles — both of different type or similar but perhaps, not exiting the surface of the specimen in direct response to the bombardment of the surface by the field emission beam. It is herein theorized that wherein a field emission gun is used as an electron source (although the invention concept applies to any charged particle system) the system consists of a field emission tip[10], a first anode[12], and a power supply ($V_1$) to pull electrons from the tip (see FIG. 1). The electrons which are generated at the tip pass through the aperture in the first anode[12] may be accelerated or decelerated by the next electrode (second anode[14]) depending upon the magnitude of $V_2$. In many cases $V_2 > V_1$ which means that the electrons passing through the aperture in the first anode are accelerated. Many electrons from the tip strike the first anode, however, and produce secondary and backscattered electrons at this surface. When $V_2$ is greater than $V_1$, many of these secondary and backscattered electrons find their way into the accelerating field region caused by the cooperative focusing and accelerating influence of the first and second anodes; for example, an electric field can fringe through the hole in the first anode caused by the effective voltage applied between the first and second anode. The fringing field collects many of the secondary electrons produced on the surface of the first anode and accelerates them toward the second anode (see FIG. 2). The primary electron beam (beam energy $\simeq eV_2$) can be focused to a very small probe size as described in the foregoing references. The secondary beam (beam energy $\simeq e(V_2 - V_1)$) produces a very diffuse "spray" of secondary electrons. In addition, this secondary spray of electrons has an energy different from the primary beam. The number of undesired diffuse secondary electrons, I have found, can be as high as that of the desired primary electrons. The primary beam of electrons is used for many different applications such as previously described, most of which require monoenergetic, well-focused electron probes. The described secondary electron spray constitutes "spatial noise" in a scanning electron probe because areas other than those desired are being bombarded by the spray electrons while the well-focused primary probe is irradiating the area of interest. These spray electrons can cause a large increase in background noise when viewing or recording spatial information about the specimen using the various electron, photon, X-ray, etc. detectors. In addition, the secondary spray creates a broad effective energy spread in the beam at the specimen plane which greatly impairs or confuses the detector and degrades the accuracy or examination of physical phenomena which require a monoenergetic source of excitation and detection such as electron spectroscopy and transmission microscopy.

One of the several objects of the invention is the inclusion of means within the field emission electron gun to generate field intermediate the field emission tip and the principle accelerating field to forestall the entry of secondary electrons from the cloud formed around the tip and field forming electrode into the main accelerating field.

One example of these objects is illustrated by the inclusion of a third electrode biased so as to prevent the secondary electrons produced by the unused portion of the tip current, or other stray currents, to pass into the accelerating section of the field emission gun.

SUMMARY OF THE INVENTION

In accordance with the present invention there is disclosed a field emission gun including means for improving the signal to noise ratio recoverable from a charged particle beam which may be generated within the gun by the minimization of the accelerating of secondary electrons generated within the gun by the beam.

Certain of the features of the invention include a field emission tip, an extraction anode, which may be a separate electrode or the first anode of a focusing and accelerating anode pair, and means for interposing between the tip and the accelerating field of the anode pair an electric field of a strength, expressed in terms of electron voltage, at least equal to the lowest energy secondary electron sought to be prevented from the accelerating field. In accordance with the present invention a field of more than 5 volts and less than 50 volts is preferable.

BRIEF DESCRIPTION OF THE DRAWINGS

FIG. 1 is a schematic diagram of a charged particle gun illustrating the prior art.

FIG. 2 is a schematic diagram of a charged particle gun illustrating the problem solved by the present invention.

FIG. 3 is a schematic diagram of a charged particle gun illustrating the present invention.

DESCRIPTION OF PREFERRED EMBODIMENTS

Figure 4:
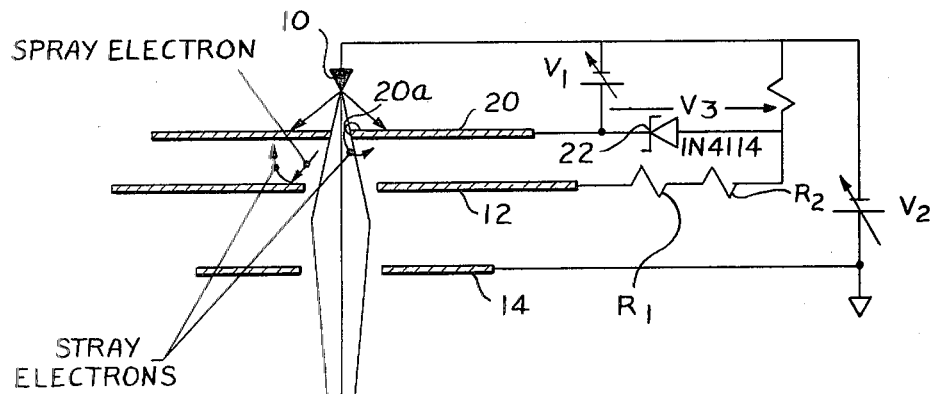
FIG. 4 is a schematic diagram of an alternate embodiment of the invention.

The present invention will be described in reference to the principle operating elements of a field emission scanning electron microscope. It should be recognized, however, that the invention broadly relates to charged particle systems and different polarities may be indicated than for such as ion probes.

Referring to FIG. 1, reference numeral 10 indicates generally the field emission tip. Disposed down stream of the tip 10 relative to the beam 11 generated by tip 10 are first anode 12 and second anode 14. In the illustrated embodiment wherein only two electrodes are utilized, voltage source $V_1$ is applied to anode 12 to establish the requisite field for emission of beam 11 from tip 10. Voltage source $V_2$ is connected to second anode 14 to provide the requisite focusing and accelerating field between anodes 12 and 14 to cause the illustrated focusing of beam 11 at specimen 16. It will be noted that aperture 12a in anode 12 admits the useable electrons for forming beam 11, whereas unuseable electrons 11e are precluded from forming a part of beam 11.

Reference to FIG. 2 illustrates the formation of a secondary electron cloud in the region of anode 12 by the unuseable electrons 11e and their attraction to the focusing and accelerating field between anodes 12 and 14. It will be noted that these electrons are generally captured by the field of anodes 12 and 14 and projected toward the specimen 16 as a defocused secondary electron spray $11e^1$.

It has been determined that the bombardment of a surface such as anode 12 by a beam of otherwise unuseable electrons 11e generates a cloud of electrons having electron energies ranging generally from 5 to 50 volts, with the vast majority of electrons being between 7 and 15 volts. These electrons, it may be seen, if they fall into the field of anodes 12 and 14 are accelerated to an energy of approximately $e(V_2-V_1)$. Wherein the difference between $V_1$ and $V_2$ is relatively large (as in field emission electron microscopes) it will be appreciated that in addition to the bombardment of specimen 16 by the primary beam 11 of energy apparently $eV_2$, there is a general spray illumination of electrons 11e at energy approximately $e(V_2-V_1)$, or close to $eV_2$. If the investigation of the surface of specimen 16 is dependent upon the determination of the effect of the impact of primary beam 11 by detection of the electrons caused to exit the surface, it must be realized that the presence of the spray electrons 11e interfere with such detection.

I have determined that in recognition of the problem, the inclusion of a decelerating electron field having an effect at least equal to the energy level of the secondary electron sought to be stopped between the source (tip 10) and the main field (anodes 12, 14) will form a barrier to the acceleration of such electrons (11e) into a diffused spray. Since the majority of secondary electrons sought to be stopped fall within 7 to 15 volts, a reverse field above that range will stop all electrons of a voltage less than the selected field. Thus, if a field is established between electrodes of approximately 20 volts differential, all electrons up to 20 volts will be stopped from drifting through that field. In the instant case, the field of 20 volts will form a barrier to the bulk of the secondary electrons with which I am concerned, namely those having energies of from 7 to 15 volts. It should be noted that the barrier field strength must be held to a level below that which would exert an appreciable influence on the electrons of the primary beam 11. Accordingly, two orders of magnitude less is necessary, and more is preferable (e.g., less than 200 volts for a 20kV system is necessary, and such as 50 volts is preferable).

One specific embodiment of the invention is achieved by introducing a third electrode and using a voltage biasing technique which does not allow secondary electrons, which are produced by the unused portion of the tip current or various other stray currents, to pass into the accelerating section of the field emission gun (see FIG. 3). The tip current is generated by $V_1$, applied to the nearest electrode to the tip, in this instance an extraction electrode 20 as described in the prior references. The primary beam which passes through the aperture 20a in the extraction electrode 20 is not allowed to strike the first anode 12, but simply pass through the hole in the first anode 12a after which the beam is accelerated and focused. Those secondary electrons which are generated on the surface of the extraction electrode 20 and get through the extraction electrode aperture 20a are prevented from approaching the first anode by applying an appropriate negative bias to the first anode 12 with respect to the extraction electrode 20a. This bias forms a field between these electrodes which repels the secondary electrons 11e away from the first anode 12 so they cannot reach the acceleration region between the first and second anodes (12 and 14). In fact, when using the appropriate geometry, (i.e., proper electrode apertures and voltage sources), this biasing arrangement prevents virtually all stray low-energy electrons which are in the region above the first anode 12 from reaching the acceleration region A and producing "noise" at the specimen surface 16.

These "stray low-energy electrons" include secondary electrons which can be caused by electrons which, for various reasons, might also strike the first anode. The stray electrons produced at the surface of the first anode 12 are now attracted to the extraction electrode 20 which is at a more positive potential.

FIG. 4 is an embodiment of the present invention and also shows a representative electrical circuit used to implement the invention. The use of a 20V zener diode 22 (voltage regulator) disposed between $V_1$ and anode 12 always keeps the first anode 20 volts negative with respect to the extraction electrode 20 independent of the magnitude of tip voltage ($V_1$) required to achieve the desired emission current from the tip. The two 20 MΩ/10kV resistors $R_1$, $R_2$ in series with the lead going to the first anode show a combination of the "tip protection concept" of the previously described references, and the present invention, but are not an essential part of the present invention.

Figure 5:
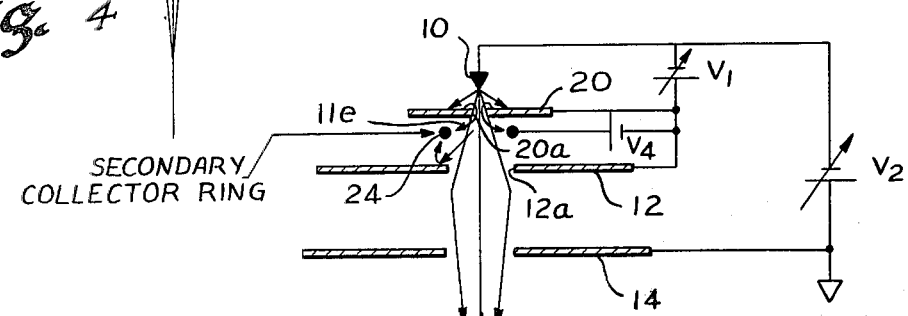
FIG. 5 is a schematic diagram of a further alternate embodiment of the invention.

Other alternative embodiments include:

A secondary collector 24 put under the extraction electrode (FIG. 5). The secondary collector 24 is biased positive (i.e., 50V) with respect to the extraction electrode 20 and the geometry in such that any secondary electrons in the area are attracted to it before they reach the accelerating region. In the illustrated embodiment collector 24 forms a ring around axis of aperture 20a and 12a and is disposed intermediate the electrodes.

Figure 6:
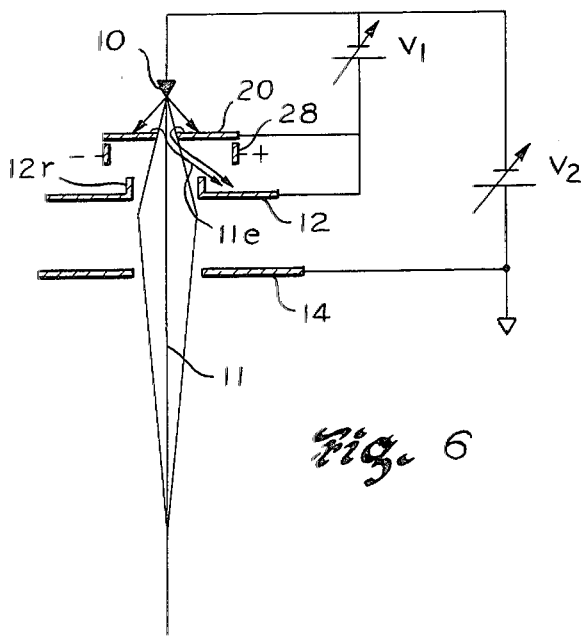
FIG. 6 is a schematic diagram of a further alternative embodiment of the invention.

Another embodiment of the invention for collecting the secondary electrons 11e before they reach the accelerating region A is the inclusion of means 28 to deflect the low energy secondaries 11e off the optical path of the primary beam 11 by electrostatic magnetic deflection plates (see FIG. 6). Electrostatic means of deflection is shown in FIG. 6. The deflection field has a much larger effect on the low energy secondaries ($\simeq$ 0-50eV) than it does on the primary electron beam ($\simeq$ 3-5keV) because of the relative field strengths. In this embodiment the spray electrons 11e may be deflected to one side of the primary beam 11 and trapped between the electrodes by the inclusion of physical means such as rim 12r or by a collateral collector (as by a reactive shield such as shown in the prior references).

The magnitude of noise caused by the secondary spray electrons can be further reduced by reducing the number of these secondaries which are generated at the surface of the extraction electrode. This may be accomplished by selecting an extraction electrode material which has a very low secondary emission coefficient at the incident energy of the electrons which are bombarding said electrode. This procedure will further enhance the present invention by reducing the statistical numbers of electrons causing the noise sought to be minimized or eliminated. In accordance with the description of the present invention, it is intended that the embodiments described herein be illustrative of the invention, and that those modifications apparent to one skilled in the art be included within the scope of the invention.

I claim:

1. In a field emission electron gun for use in such as an electron microscope including a vacuum chamber having disposed therein an electron source having a tip, a first anode spaced downstream of said tip, and a second anode spaced downstream of said first anode and voltage means connected to said first and second anodes for supplying electrical potential to establish between said anodes an extraction and a focus and accelerating field to form a beam of said electrons emunating from said source, wherein said eminating electrons also cause secondary electrons to be generated between said tip and first anode and said accelerating field causes said secondary electrons to migrate through said field, the improvement comprising the addition of an electrode intermediate said tip and said first anode, said electrode being connected to voltage means for maintaining said electrode at a potential more positive than said first anode by at least the value of the lowest energy of secondary electron sought to be prevented from migrating through said accelerating field.

2. The improvement according to claim 1 wherein gun includes an extraction electrode disposed in juxtaposition to said tip said additional electrode is disposed intermediate said first anode and said extraction electrode.

3. The improvement according to claim 2 wherein said additional electrode is a generally annular ring disposed about the axis of the beam of electrons eminating said tip and transversing said focusing and accelerating field.

4. The improvement according to claim 2 when said additional electrode includes a deflection system disposed on the side of said axis of said beam of electrons eminating said tip and transversing said focusing and accelerating field.

5. The improvement according to claim 1 wherein said additional electrode voltage is maintained at a potential of 5 to 200 volts more positive than said first anode.

6. The improvement according to claim 1 wherein said additional electrode voltage is maintained at a potential of 5 to 50 volts more positive than said first anode.

* * * * *